US008000108B2

(12) United States Patent
Schmidt et al.

(10) Patent No.: US 8,000,108 B2
(45) Date of Patent: Aug. 16, 2011

(54) METHOD AND APPARATUS FOR ENHANCED PACKAGING FOR PC SECURITY

(75) Inventors: Shon Schmidt, Seattle, WA (US); Nicholas Temple, Renton, WA (US); Kurt A. Jenkins, Sammamish, WA (US); Thomas Patrick Lennon, Seattle, WA (US); David Michael Lane, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 1090 days.

(21) Appl. No.: 11/763,820

(22) Filed: Jun. 15, 2007

(65) Prior Publication Data
US 2008/0310127 A1    Dec. 18, 2008

(51) Int. Cl.
*H01R 12/16* (2006.01)
(52) U.S. Cl. .................. 361/785; 361/782; 361/784
(58) Field of Classification Search .......... 361/782–785; 439/342, 256–260
See application file for complete search history.

(56) References Cited

U.S. PATENT DOCUMENTS

| | | |
|---|---|---|
| 4,501,461 A | 2/1985 | Anhalt |
| 4,616,895 A | 10/1986 | Yoshizaki et al. |
| 4,620,761 A | 11/1986 | Smith et al. |
| 4,953,930 A | 9/1990 | Ramsey et al. |
| 5,358,421 A | 10/1994 | Petersen |
| 6,164,999 A | 12/2000 | McCutchan et al. |
| 6,190,181 B1 | 2/2001 | Affolter et al. |
| 6,347,946 B1 | 2/2002 | Trobough et al. |
| 6,535,002 B2 * | 3/2003 | Haseyama et al. ............ 324/754 |
| 6,609,923 B2 * | 8/2003 | Sato et al. .................... 439/259 |
| 6,712,630 B1 | 3/2004 | Davidov et al. |
| 7,121,065 B2 * | 10/2006 | Christ ............................ 53/453 |
| 2004/0192104 A1 | 9/2004 | Chiu |
| 2005/0030718 A1 | 2/2005 | Villanueva et al. |

FOREIGN PATENT DOCUMENTS

| | | |
|---|---|---|
| JP | 1994317630 | 11/1994 |
| JP | 1996097261 | 4/1996 |
| JP | 1998038972 | 2/1998 |
| JP | 2005347220 A | 12/2005 |

OTHER PUBLICATIONS

Written Opinion for PCT/US2008/066089 mailed Dec. 22, 2008.
International Search Report for PCT/US2008/066089 mailed Dec. 22, 2008.
"Ball/Land Grid Array Sockets," http://e-tec.ch/v2/IC_Products/IC_BGA-qui_060325.pdf.
"How to Install an AMD Athlon or Duron Socket a Processor," http://www.duxcw.com/digest/Howto/cpu/socka/1.html.
"Package Types for Mobile Intel Processors," http://www.intel.com/support/processors/sb/CS-009864.htm.

* cited by examiner

*Primary Examiner* — Tuan T Dinh

(57) ABSTRACT

A method having a socket for coupling signals between an electrical component and a circuit board or equivalent has a mechanism that, when activated, attaches the electrical component to the socket so that it is not possible to remove the electrical component without damaging it. The mechanism may include a clamshell lid with a one-time locking mechanism, a pin contact mechanism that, after initial locking, will detach the pins of the electrical component if further disturbed, or a moat around the base of the electrical component for disposing an epoxy fastener. The moat may include a heating element to cure the epoxy or other glue. The socket may include an electrical component that allows detection of tampering with the socket.

3 Claims, 11 Drawing Sheets

US 8,000,108 B2

METHOD AND APPARATUS FOR ENHANCED PACKAGING FOR PC SECURITY

BACKGROUND

Sockets are used on circuit boards, for many reasons, including to allow replacement of defective parts and to protect heat-sensitive parts during waveline or other-style soldering operations. The socket is attached to the circuit board, flexible strip, ceramic or other substrate. Then, either in a late manufacturing operation or field customization process, the electrical component may be added to the socket. Later, the component may be removed and replaced, either when found defective or to upgrade performance.

Sockets vary by size and type. Some sockets have friction-fit lead receivers, usually for lower pin-count sockets, to keep insertion easy. Higher pin count chips may use a zero-insertion force socket, where the electrical component is placed in open holes in the socket and a clamping arrangement pushes contacts against respective pins. The electrical component is held in place by the friction force of the clamp.

In many applications, a high-value component or a security-related component may be used on a circuit board. Whether to protect the overall unit from being stripped for parts or to help prevent tampering with a security-oriented part, it may be desirable to permanently attach these parts to the circuit board.

SUMMARY

A socket may be adapted to allow the versatility of late stage manufacturing or for protection during soldering operations while also helping to ensure that high value or security-related components are not removed after assembly, or at least are not removed without causing damage to the component, the socket, the circuit board or a combination of these.

In one embodiment, a socket with a sidewall and barb may allow insertion but create a substantial barrier to removal. In another embodiment, a moat-like cavity may be formed around the edge and bottom of an electrical component and an epoxy resin disposed in the cavity to attach the two. A hole in the cavity may allow the epoxy to spread to the underlying circuit board to more firmly attach the socket to the circuit board. A small heating element may be disposed in the cavity and activated to cure the epoxy, increasing the choices for type of epoxy, glue, or other cured fastener. In yet another embodiment, a closure or lid may be fastened so that once locked, it will not unlock. This may be done with either a one-way clip or by sealing the locking mechanism with epoxy. Another embodiment mar use a two-position lock where movement to the first position engages pins of the electrical component on a mechanism and movement to the second position wraps the pins around the mechanism and extracts the pins from the case of the electrical component.

DETAILED DESCRIPTION

Figure 1:
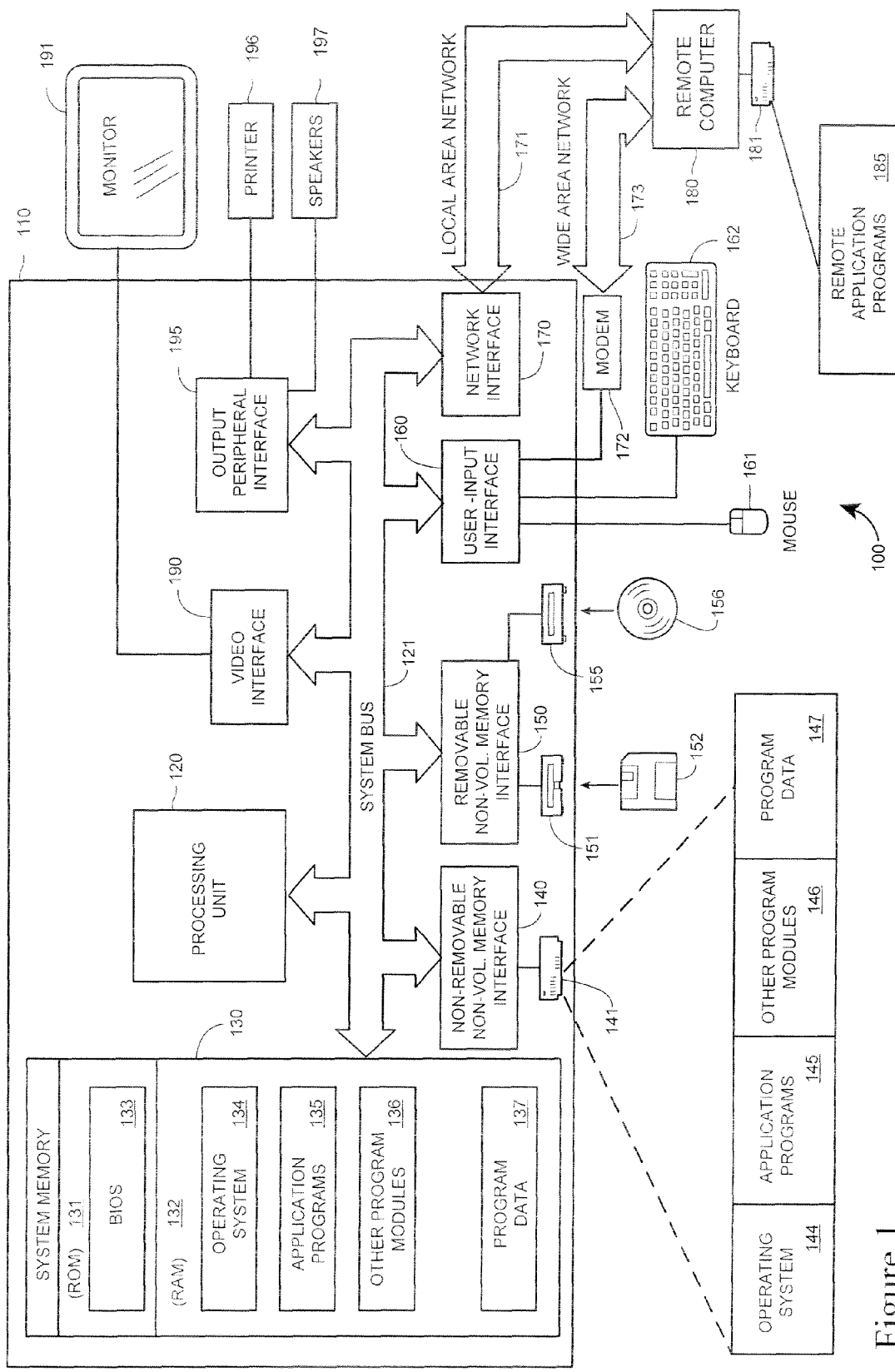
FIG. 1 is a simplified and representative block diagram of a computer.

Although the following text sets forth a detailed description of numerous different embodiments, it should be understood that the legal scope of the description is defined by the words of the claims set forth at the end of this disclosure. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims.

It should also be understood that, unless a term is expressly defined in this patent using a sentence that begins "As used herein" and finishes with, "is hereby defined to mean . . . " or a similar sentence that defines the term, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term by limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Much of the inventive functionality and many of the inventive principles are best implemented with or in software programs or instructions and integrated circuits (ICs) such as application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts in accordance to the present invention, further discussion of such software and ICs. if any, will be limited to the essentials with respect to the principles and concepts of the preferred embodiments.

Many prior-art high-value computers, personal digital assistants, organizers, and the like, are not suitable for use in a pre-pay or pay-for-use business model as is. The ability to enforce a contract requires a service provider, or other enforcement entity, to be able to affect a device's operation even though the device may not be connected to the service provider, e.g. connected to the Internet. Such enforcement may be managed using hardware, such as a special security component. In other embodiments, enforcement of the contract may be done through software embodied in a chain of trust starting with a ROM-based executable program. In these or other embodiments, it is desirable to keep identified components attached to the device. At the same time, these or other components may be of high value and may be subject to pilfering, for example, in a public setting where computers are left unattended at off-hours, etc.

FIG. 1, an exemplary system for that may use the enhanced packaging for improved security, in the way of a single insertion socket for one or more electrical components. Components shown in dashed outline are not technically part of the computer 110, but are used to illustrate the exemplary embodiment of FIG. 1. Components of computer 110 may include, but are not limited to a main processor 120, a system memory 130, a memory/graphics interface 121, also known as a Northbridge chip, and an I/O interface 122, also known as a Southbridge chip. A memory 130 and a graphics processor 190 may be coupled to the memory/graphics interface 121. A monitor 191 or other graphic output device may be coupled to the graphics processor 190. The main processor 120, the memory/graphics interface 121 and the I/O interface 122 may be examples of high-value electrical components that would be candidates for protection using the single-insertion socket.

A series of system busses may couple various these system components including a high speed system bus 123 between the main processor 120, the memory/graphics interface 121 and the I/O interface 122, a front-side bus 124 between the memory/graphics interface 121 and the system memory 130, and an advanced graphics processing (AGP) bus 125 between the memory/graphics interface 121 and the graphics processor 190. The system bus 121 may be any of several types of bus structures including, by way of example, and not limitation, such architectures include Industry Standard Architecture (ISA) bus, Micro Channel Architecture (MCA) bus and Enhanced ISA (EISA) bus. As system architectures evolve, other bus architectures and chip sets may be used but often generally follow this pattern. For example, companies such as Intel and AMD support the Intel Flub Architecture (IHA) and the Hypertransport architecture, respectively.

A security module 129 may store information associated with securely booting the computing, such as a measured BIOS. The security module 129 may support metering of the computer 110 by monitoring operation of the computer 110 and subtracting value from a local pre-paid account, or may compare a subscription expiration date to a current date/time. The security module 129 may also include cryptographic circuitry for validating updates to the metering criteria, e.g. additional value or updated subscription end date. In other embodiments, the functions of the security module 129 may also be incorporated in other circuitry, such as the I/O interlace 122 or the memory/graphics interface 121. The security module 129 may also use a single-insertion socket to held prevent tampering either by outright removal, or by 'cut and jumper' techniques to re-reroute signals to and from the security module 129.

As described in U.S. patent application Ser. No. 11/612, 436, filed Dec. 18, 2006, a component, such as the security module 129, may be physically covered by another, larger, component to provide tamper protection to the smaller component. The use of the anti-tampering socket is applicable for protection of a standalone security module, such as security module 129, a circuit incorporating the functions of the security module, such as the I/O interface 122, or a circuit that is physically surrounding the security module. In the metered use embodiment, the security module 129 or equivalent is ideally suited for protection by an anti-tampering socket. However, in other embodiments, a high-value circuit may be protected by an anti-tampering socket to lower the attractiveness of theft of a device incorporating the high-value circuit for the purpose of parts stripping.

The system memory 130 includes computer storage media in the form of volatile and/or nonvolatile memory such as read only memory (ROM) 131 and random access memory (RAM) 132. The system ROM 131 may contain permanent system data 143, such as identifying and manufacturing information. In some embodiments, a basic input/output system (BIOS) may also be stored in system ROM 131. RAM 132 typically contains data and/or program modules that are immediately accessible to and/or presently being operated on by main processor 120. By way of example, and not limitation. FIG. 1 illustrates operating system 134, application programs 135, other program modules 136, and program data 137.

The I/O interface 122 may couple the system bus 123 with a number of other busses 126, 127 and 128 that couple a variety of internal and external devices to the computer 110. A serial peripheral interface (SPI) bus 128 may connect to a basic input/output system (BIOS) memory 133 containing the basic routines that help to transfer information between elements within computer 110, such as during start-up.

A super input/output chip 160 may be used to connect to a number of 'legacy' peripherals, such as floppy disk 152, keyboard/mouse 162, and printer 196, as examples. The super I/O chip 122 may be connected to the I/O interface 121 with a low pin count (LPC) bus, in some embodiments. Versions of the super I/O chip 122 are widely available in the commercial marketplace. The super I/O chip 122 may benefit from permanent attachment to the computer 110 using a single-insertion socket.

The computer 110 may also include other removable/non-removable, volatile/nonvolatile computer storage media. By way of example only. FIG. 1 illustrates a hard disk drive 140 that reads from or writes to non-removable, nonvolatile magnetic media. Removable media, such as a universal serial bus (USB) memory 152 or CD/DVD drive 156 may be connected to the PCI bus 128 directly or through an interlace 150.

The drives and their associated computer storage media discussed above and illustrated in FIG. 1, provide storage of computer readable instructions, data structures, program modules and other data for the computer 110. In FIG. 1, for example, hard disk drive 140 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. Memory circuits including SIP packaged parts may be a target for pilfering. A version of single in-line socket using a locking lid may be used to prevent alteration of the memory configuration.

The computer 110 may operate in a networked environment using logical connections to one or more remote computers, such as a remote computer 180 via a network interface controller (NIC) 170. The NIC 170 may be attached to the computer using a single insertion socket.

In some embodiments, the network interface may use a modem (not depicted) when a broadband connection is not available or is not used. It will be appreciated that the network connection shown is exemplary and other means of establishing a communications link between the computers may be used.

Figure 2:
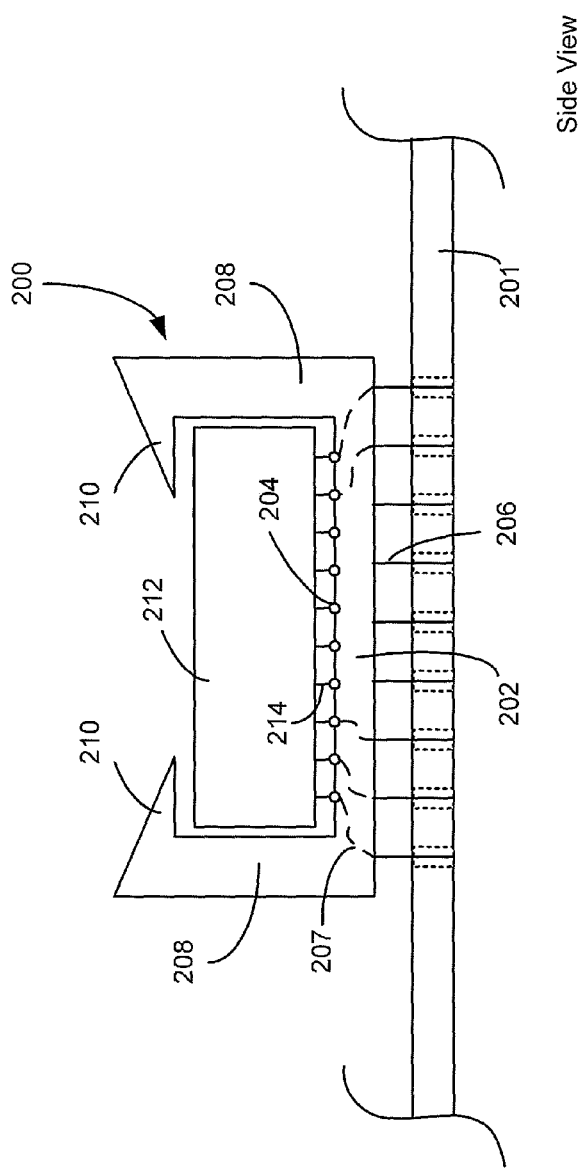
FIG. 2 is a section view of an anti-tamper socket.
Figure 3:
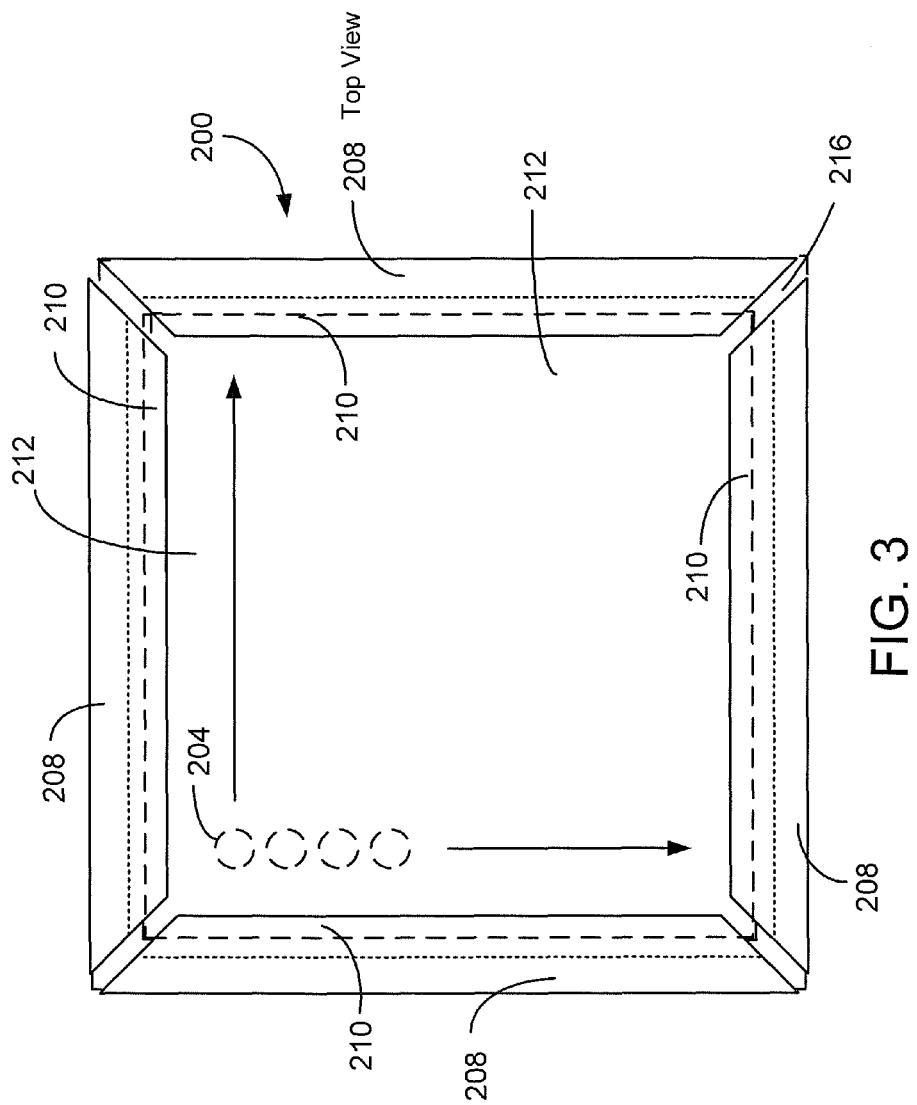
FIG. 3 is a top view of the socket of FIG. 2.

FIGS. 2 and 3 illustrate a section view and a top view, respectively, of one embodiment of an anti-tamper socket 200. The socket 200 is one of several embodiments for an anti tamper socket. The socket 200 may be disposed on a circuit board 201. The socket may be constructed of plastic, such as by injection molding. The socket 200 may have a base 202 with top-side connectors 204 and bottom-side attachments 206. In FIG. 2, the bottom-side attachments 206 are shown as pins, but other connection technologies may be used, such as solder bumps or ball grid arrays. A set of conductors represented by conductor 207 connects top-side connectors 204 with respective bottom-side attachments 206. The socket 200 may also have a plurality of sidewalls 208, usually four, each sidewall 208 having a barb 210. An electrical component 212 is shown inserted in the socket 200, with pins 214 of the electrical component 212 inserted into the top-side connectors 204.

FIG. 3 shows the socket 200 with electrical component 212 inserted. The circuit board 201 of FIG. 2 is not depicted. Shown dashed are the top-side connectors 204 of the socket 200. When ready for insertion, the electrical component 212 will be placed on the top side of the barbs 210 surrounding the socket 200. Downward pressure on the top-side of the barbs 210 will cause the sidewalls 208 to deflect outward. When the electrical component 212 is inserted, the sidewalls 208 will return to their original position, locking the electrical component 212 in place. The socket 200 is shown with mitered corners 216. The mitered corners may aid tamper-resistance by improving shielding of the electrical component 212 from probing or other access from the side. However, other configurations of the socket 200 may have only one pair of opposing sidewalls with barbs.

Figure 4:
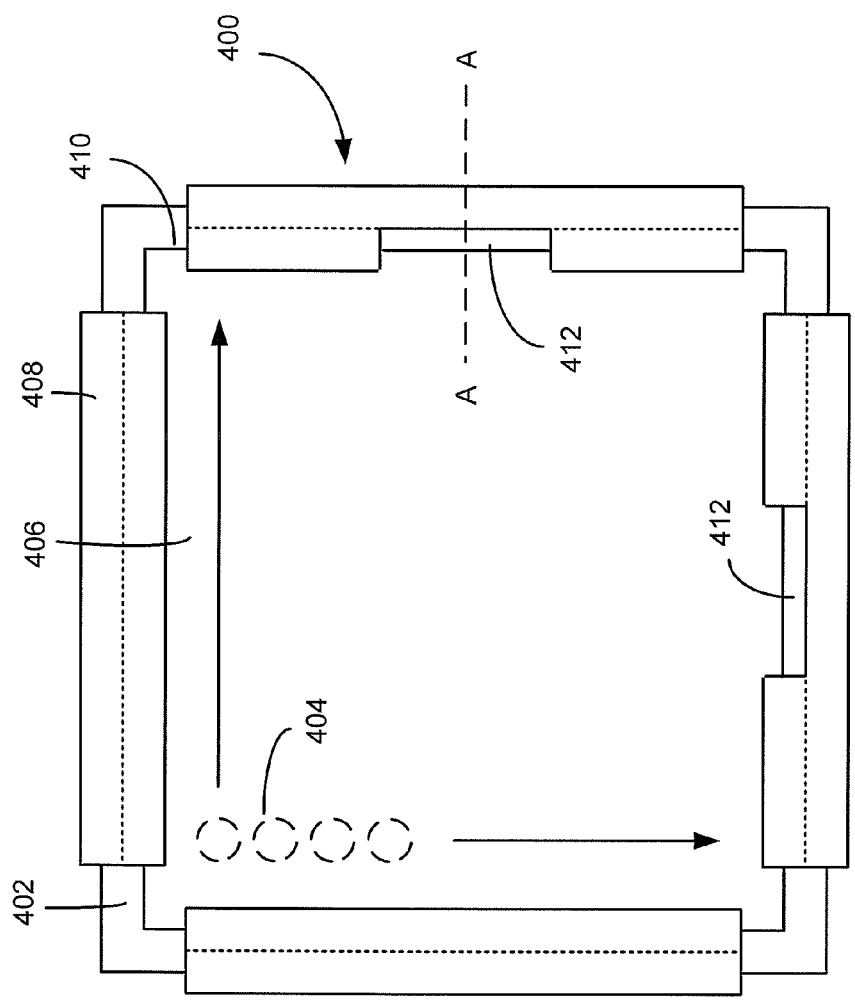
FIG. 4 is a top view of another anti-tamper socket.
Figure 5:
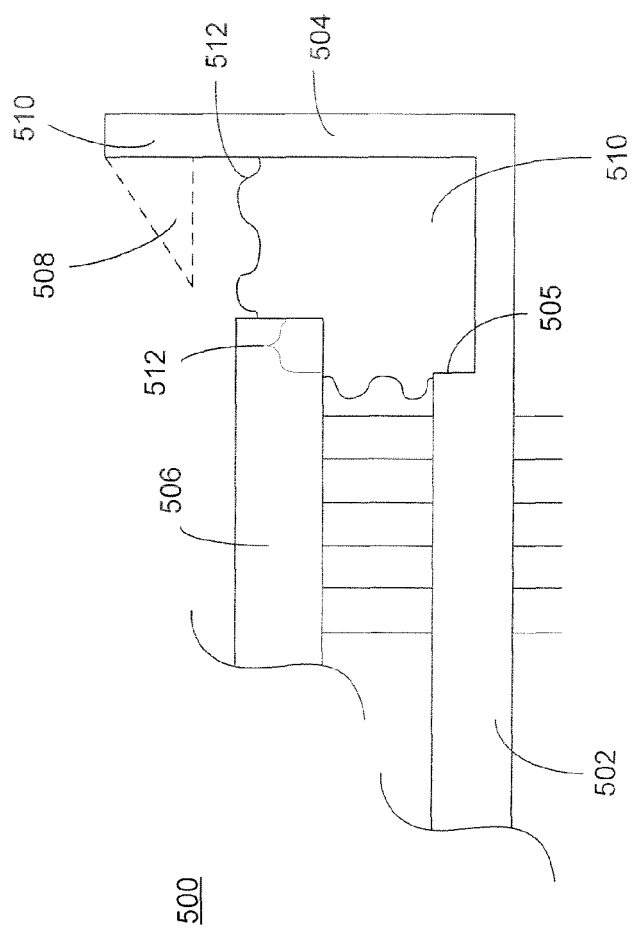
FIG. 5 is a section view of the socket of FIG. 4.

FIGS. 4 and 5 illustrate a top view and section view, respectively, of another embodiment of an anti-tamper socket. FIG. 4 is a top view of another embodiment of an anti-tamper socket 400. The socket 400 has a base 402 with contacts 404 arrayed to match a mating electrical component 406. The socket 400 may have sidewalls 408 similar to the sidewalls 208 of the socket 200 of FIGS. 2 and 3. The corner 410 of the illustrated socket 400 is open, compared with the mitered corner of the socket illustrated in FIG. 3.

One or more sidewalls 408 may have a bore 412 extending along the height of the sidewall 408 to the base 402. The bore may be used for disposing a liquid fastener, such as an epoxy, after the electrical component 406 is placed in the socket 400.

FIG. 5 is a section view 500 along line A-A of the socket of FIG. 4. A base 502 of the socket 400 is connected to a sidewall 504 that is spaced apart, or distal, from an edge of the base 505 so that a cavity 510 is created between the edge 505, the sidewall 504, and an overhang 512 of the electrical component 506. The sidewall 504 may have a barb 508 that operates as described above. In another embodiment, the sidewall 504 is straight and does not have the barb 508.

As illustrated in the section view 500 showing the socket 400 at the bore 412, an opening is created from the top to the cavity 510. A liquid fastener, glue, or cement may be injected via the bore 412 into the cavity 510. A top-level 514 of the liquid fastener reach to the side of the electrical component 506 or may be higher or lower. Ideally, the top-level 514 of the liquid fastener will reach the overhang 512 so as to attach the electrical component 506 to the socket 400. When the liquid fastener has cured and hardened, removing the electrical component 506 may require damaging both the electrical component 506 and the socket 400.

Figure 6:
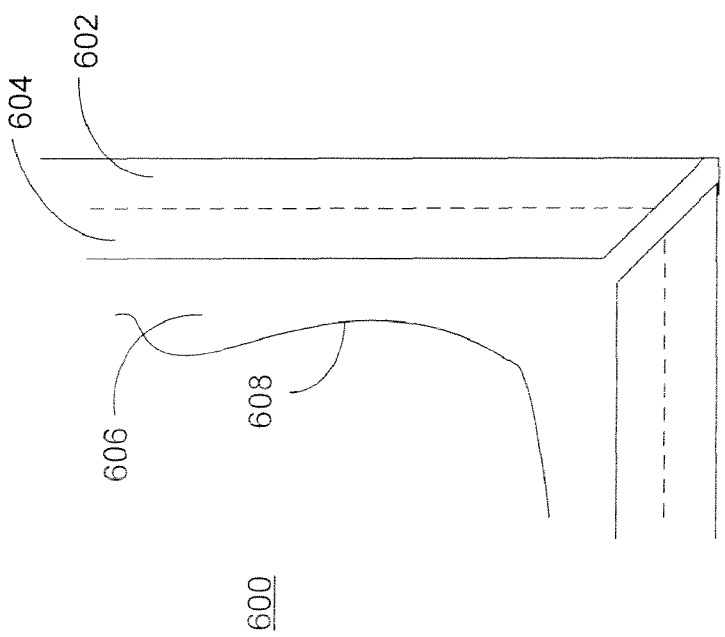
FIG. 6 is a socket with an integrated tamper sensor.

FIG. 6 is a top view of a portion of a socket 600, similar to the socket of FIGS. 4 and 5. The socket 600 is shown with a sidewall 602 and a barb 604. A cavity 606 is formed by the sidewall 602 and an edge 608, similar to edge 505 in FIG. 5. The edge 608 follows a curve. The curved edge 608 makes it more difficult to mill around the side of the socket 600 to remove the cured fastener or epoxy, and then to be able to remove an electrical component, such as electrical component 506 of FIG. 5.

Figure 7:
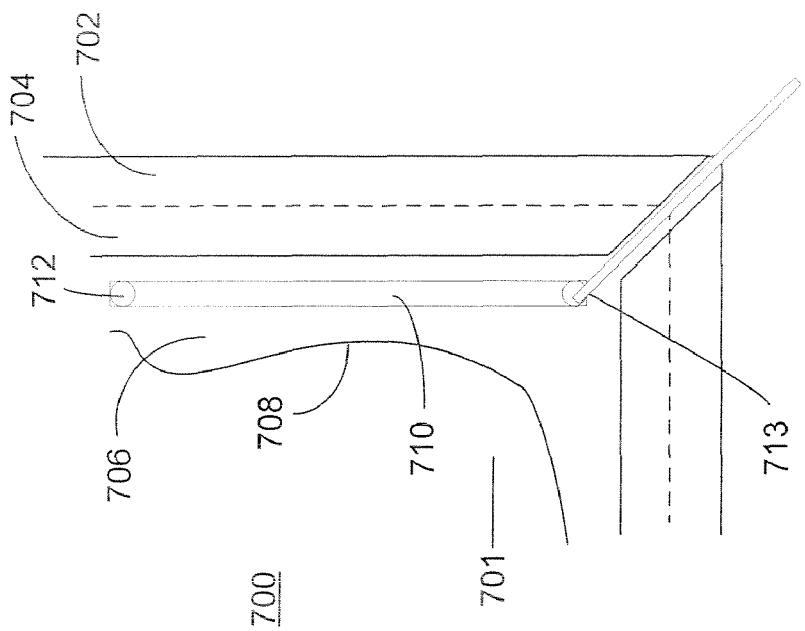
FIG. 7 is a top view of a portion of a socket with a modification of the socket of FIG. 4.

FIG. 7 is a top view of another embodiment of an anti-tamper socket 700, similar to the sockets of FIGS. 4 and 6. The socket 700 may have a base 701 and sidewalls 702. A barb 704 may or may not be present. A cavity 706 may be formed by an edge 708 of the base 701 and the sidewall 702. A heating element 710 may be disposed in the cavity 706 and coupled to electrical contacts 712 and 713. In another embodiment, a connecting wire 714 of the heating element 710 may be fed through a corner opening in the socket 700. After liquid fastener is disposed in the cavity 706, the heating element 710 may be activated to generate heat to cure the liquid fastener. This may allow use of a wider range of liquid fasteners, such as some epoxies that don't cure well at room temperature. Additionally, the use of the heating element may shorten overall cure times and improve manufacturing throughput.

Figure 8:
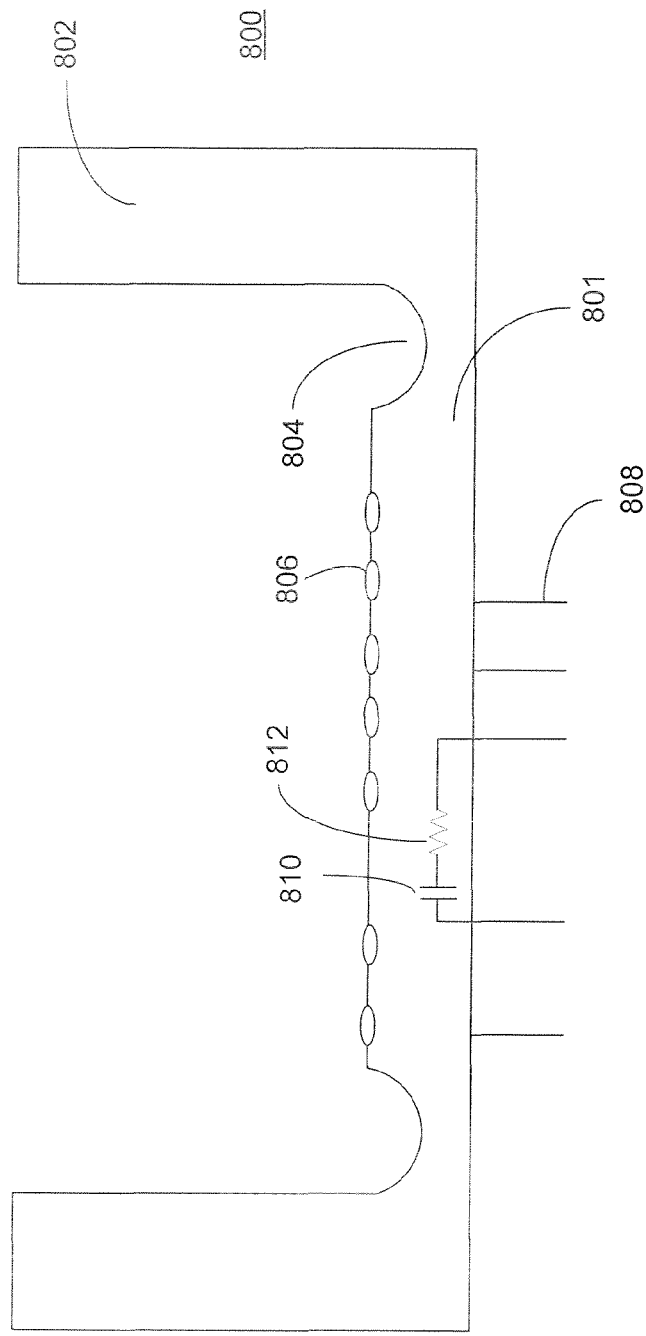
FIG. 8 is a top view of a modification of the socket of FIG. 7.

FIG. 8 illustrates a socket 800 with an integrated tamper sensor. The socket 800 has a base 801 and a sidewall 802. The base 801 may have upper connectors 804 and lower connectors 806 for connection with an electrical component (not depicted) and a circuit board (not depicted), respectively. The socket 800 may have integral circuitry to provide evidence to an external entity, such as a processor, whether the socket has been attacked. The circuitry may include a capacitor 810 and a resistor 812, or other circuits as may be expedient or effective. For example, the capacitor 810 and the resistor 812 may be part of an oscillator circuit. Removing the socket will be detectable. Further, one or more of the components in the socket 800 may be heat sensitive, such that attempts to de-solder or 'soften' sidewall material in an attempt to deform the sidewall 802 can be detected, even after the attempt.

Figure 9:
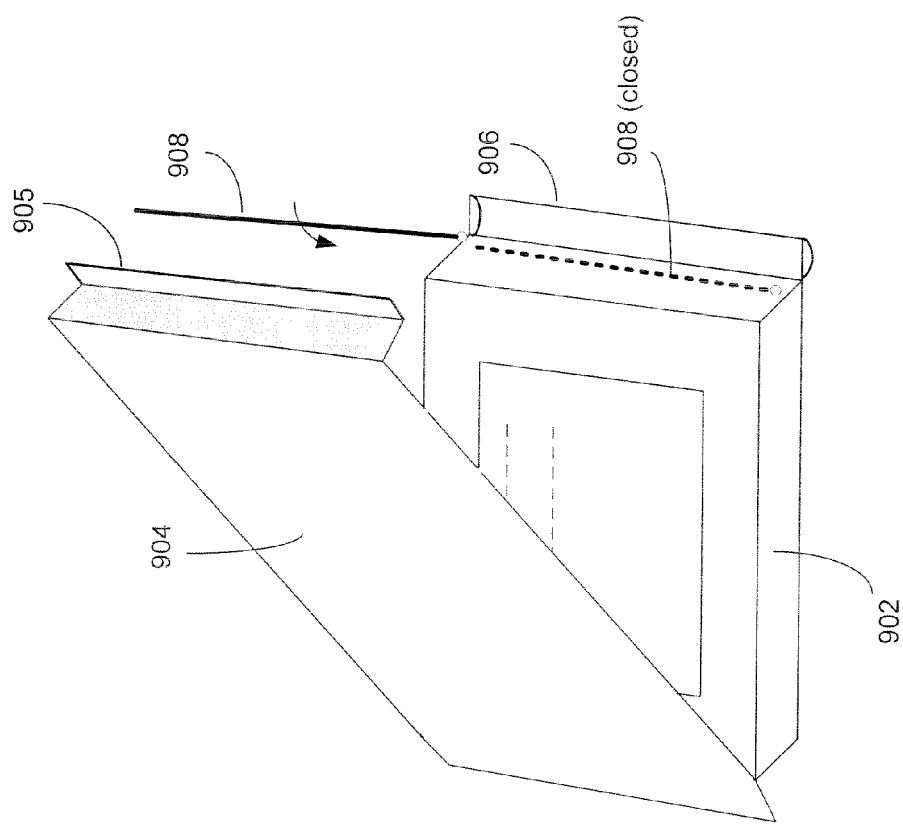
FIG. 9 is a perspective view of a socket with a clamshell lid and locking bar.

FIG. 9 is a perspective view of an exemplary socket 900 with a clamshell lid and locking bar. The socket 900 may include a base 902 and a lid 904. The lid 904 may have a lip 905 that engages a trough 906. When closed, the lip 905 may engage the trough 906. A locking bar 908 may be rotated over the lip 905 to lock the lip 905 in the trough 906. An epoxy filler may be added to the trough 906 to permanently fix the lid 904 to the base 902.

Figure 10:
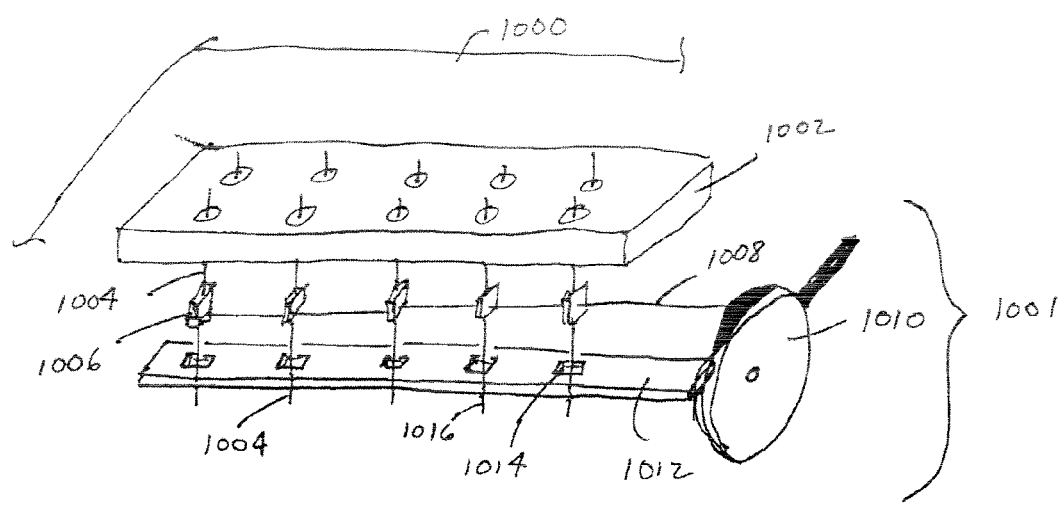
FIG. 10 is a plan view of a portion of a socket showing a destructive mechanism for locking an electrical component to the socket.

FIG. 10 is a plan view of a portion of a socket 1000 showing a destructive mechanism 1001 for locking an electrical component 1002 to the socket 1000. Pins 1004 extend from the electrical component 1002 through electrical contacts 1006. The electrical contacts 1006 are contacted by a rod 1008 coupled to an eccentric ratchet 1010. The eccentric ratchet 1010 may be coupled to a shaft 1012 with apertures 1014 through which the pins 1004 may extend. The shaft 1012 may be non-conductive, so that unintended cross-connection does not occur.

When the electrical component 1002 is inserted, the eccentric ratchet 1010 may be rotated to a first position to drive the rod 1008 to engage the electrical contacts 1006 with their respective pins 1004. Further movement of the eccentric ratchet 1010 to a second position, for example, in an attempt to release the electrical component 1002, of the eccentric ratchet 1010 may cause the shaft 1012 to wrap up the pins 1004 and extract the pins 1004 from the electrical component 1002. Many other embodiments of the eccentric ratchet 1010, the rod 1008, and the electrical contacts 1006. For example, the eccentric ratchet 1010 may only engage the shaft 1012 after movement to the first position, after which, movement in any direction can cause the rotation of the shalt 1012. Rotation of the shaft 1012 may wrap up the pins 1004 and pull them from the electrical component 1002, rendering it useless.

Figure 11:
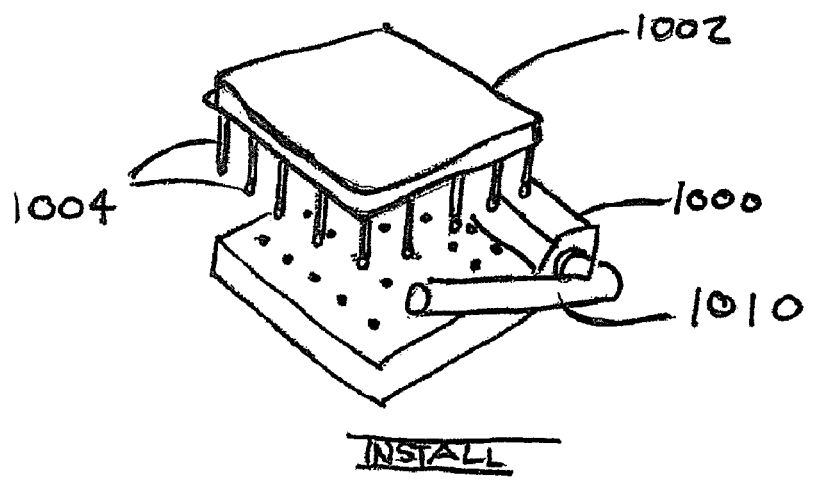
FIG. 11 shows an electrical component ready for installation into a socket.
Figure 12:
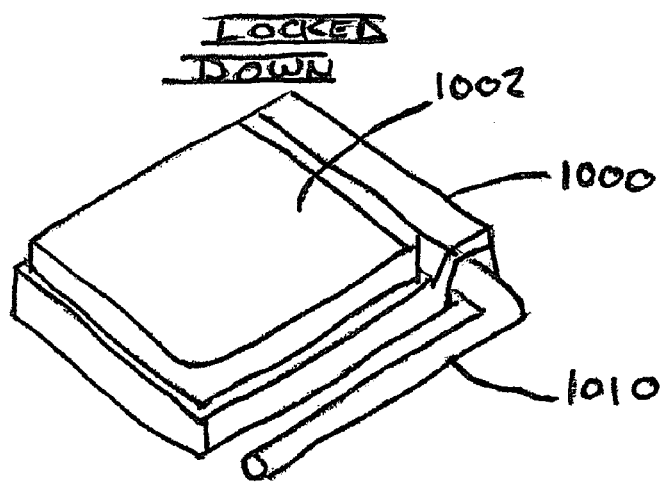
FIG. 12 shows a socket with an electrical component installed.
Figure 13:
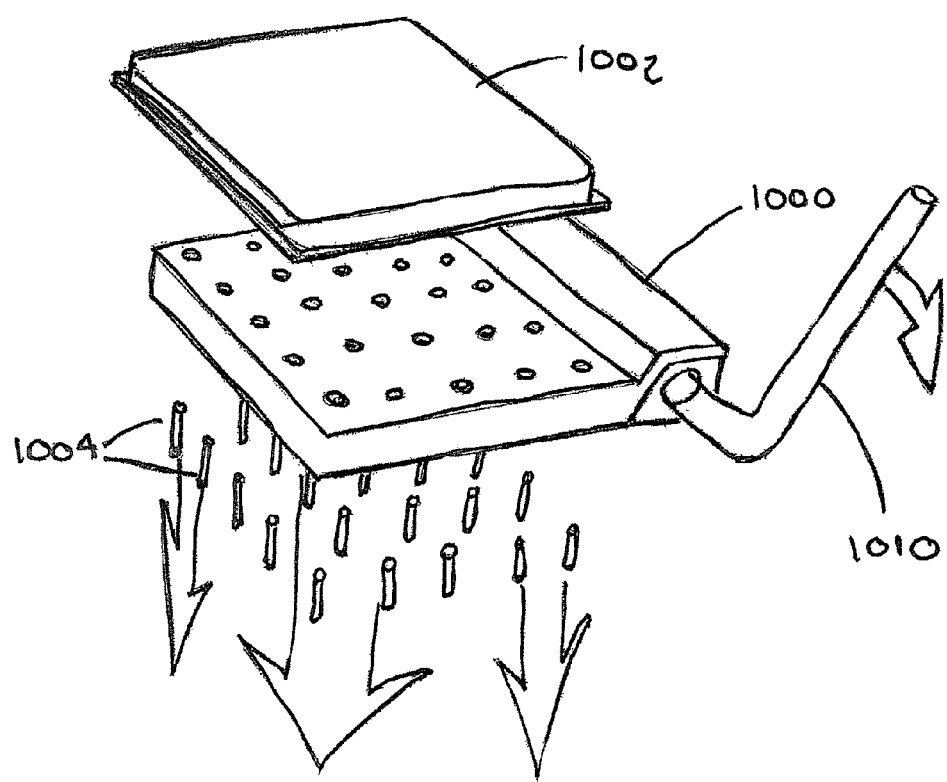
FIG. 13 illustrates a socket after attempted removal of an electrical component.

FIGS. 11-13 illustrate operation of the socket 1000.

FIG. 11 shows the electrical component 1002 ready for installation into the socket 1000. The eccentric ratchet 1010 (showing handle only) is in a ready position. Pins 1004 are aligned with corresponding holes in the socket.

FIG. 12 shows the socket 1000 with the electrical component 1002 installed. The eccentric ratchet 1010 is in the locked and operational position.

FIG. 13 illustrates the socket 1000 after attempted removal of the electrical component 1002. Movement of the eccentric ratchet 1010 causes the shaft 1012 of FIG. 10 to engage pins 1004 and physically pull them from the packaging of the electrical component 1002. Re-attaching electrical connections to the sites where pins have been removed is beyond the capability of all but the most sophisticated facilities and effectively destroys the electrical component 1002.

The many alternate embodiments described above for a single insertion socket illustrate useful mechanisms that allow late customization or postponed personalization for any electronic device with high value or security-critical components. The use of the single insertion socket eliminates the opportunity to field replace a failed electrical component using such as socket. An assumption is made that electronic devices are rarely repaired when major components fail. To balance the point, however, major components rarely fail during the useful life of the modern electronic devices, for example, computers and other consumer electronics equipment.

Although the foregoing text sets forth a detailed description of numerous different embodiments of the invention, it should be understood that the scope of the invention is defined by the words of the claims set forth at the end of this patent. The detailed description is to be construed as exemplary only and does not describe every possibly embodiment of the invention because describing every possible embodiment would be impractical, if not impossible. Numerous alternative embodiments could be implemented, using either current technology or technology developed after the filing date of this patent, which would still tall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

We claim:

1. A method of preventing successful removal of an electrical component from a circuit board using a socket adapted to a single insertion of the electrical component, the method comprising:
   fixedly attaching the socket having a plurality of signal contacts to the circuit board;
   setting a locking lever to a first position that allows insertion of the electrical component to the socket;
   inserting the electrical component into the socket;
   setting the locking lever to a second position that i) causes electrical contact between a pin of the electrical component and a corresponding pin of the socket and ii) positions the pin into an opening in a rotating bar;
   operating the electrical component;
   attempting to opening the socket by setting the locking lever form the second position which causes the rotating bar to rotate such that the pin is captured in the opening and remove from the electrical component, and wherein a switch engages when tampering is detected.

2. An apparatus comprising:
   a circuit board comprising a socket affixed to the circuit board and having a plurality of contacts providing conductivity between the socket and circuitry of the circuit board;
   the socket comprising pin holes and a locking lever settable to an open position to allow seating of an electrical component in the socket, and settable to a closed position that secures the electrical component in the socket such that pins of the electrical component are in the pin holes;
   the socket including a rotating bar with openings through which the pins pass when the pins are in the pin holes, such that when the locking letter is moved from the closed position to the open position while the electrical component is in the socket, the rotating bar rotates and removes the pins from the electrical component; and
   the socket further comprising a circuit when removed from the circuit board causes the circuitry of the circuit board to detect that the socket has been removed.

3. An apparatus comprising according to claim 2, the socket further comprising a bar that engages only when the locking lever has been set to the closed position.

* * * * *